(12) United States Patent
Torii

(10) Patent No.: US 7,893,498 B2
(45) Date of Patent: Feb. 22, 2011

(54) SEMICONDUCTOR DEVICE

(75) Inventor: Katsuyuki Torii, Niiza (JP)

(73) Assignee: Sanken Electric Co., Ltd. (JP)

( * ) Notice: Subject to any disclaimer, the term of this patent is extended or adjusted under 35 U.S.C. 154(b) by 23 days.

(21) Appl. No.: 10/591,006

(22) PCT Filed: Jan. 30, 2006

(86) PCT No.: PCT/JP2006/301489

§ 371 (c)(1),
(2), (4) Date: Aug. 28, 2006

(87) PCT Pub. No.: WO2006/085448

PCT Pub. Date: Aug. 17, 2006

(65) Prior Publication Data

US 2007/0205442 A1    Sep. 6, 2007

(30) Foreign Application Priority Data

Feb. 10, 2005  (JP) .............................. 2005-034881
Oct. 6, 2005  (JP) .............................. 2005-293802

(51) Int. Cl.
    *H01L 23/62* (2006.01)
(52) U.S. Cl. .............................. 257/362; 257/E27.106; 257/361
(58) Field of Classification Search ................. 257/362, 257/E27.106, 361
    See application file for complete search history.

(56) References Cited

U.S. PATENT DOCUMENTS

| | | |
|---|---|---|
| 4,199,774 A | 4/1980 | Plummer |
| 4,532,534 A | 7/1985 | Ford et al. |
| 4,639,762 A | 1/1987 | Neilson et al. |
| 4,860,072 A | 8/1989 | Zommer |
| 4,881,106 A | 11/1989 | Barron |
| 4,959,699 A | 9/1990 | Lidow et al. |
| 5,089,864 A | 2/1992 | Sakurai |
| 5,187,555 A | 2/1993 | Kuroda et al. |

(Continued)

FOREIGN PATENT DOCUMENTS

JP          9-129878          5/1997

(Continued)

OTHER PUBLICATIONS

Machine Translation of JP2004-228553, Torii et al, Aug. 2004, 19 pages.*

(Continued)

*Primary Examiner*—Bradley K Smith
*Assistant Examiner*—Alexander Belousov
(74) *Attorney, Agent, or Firm*—Kilpatrick Townsend & Stockton LLP

(57) ABSTRACT

A semiconductor device 10 comprises a P type base region 13 formed in an $N^-$ type base region 11, and $N^+$ type emitter regions 14 formed plurally in the P type base region 13 so as to be spaced form each other. The $N^+$ type emitter regions 14 are formed such that the rate of the area occupied by the $N^+$ type emitter region 14 in the P type base region 13 at the center part of the semiconductor device 10 is smaller than the rate of the area occupied by the $N^+$ type emitter region 14 in the P type base region 13 at the peripheral part of the semiconductor device 10.

4 Claims, 13 Drawing Sheets

U.S. PATENT DOCUMENTS

| | | | |
|---|---|---|---|
| 5,229,629 | A | 7/1993 | Koike |
| 5,237,481 | A | 8/1993 | Soo et al. |
| 5,497,014 | A * | 3/1996 | Momose .................... 257/205 |
| 5,557,127 | A | 9/1996 | Ajit et al. |
| 5,631,484 | A | 5/1997 | Tsoi et al. |
| 5,917,207 | A | 6/1999 | Colwell et al. |
| 5,973,376 | A | 10/1999 | Rostoker et al. |
| 6,002,153 | A * | 12/1999 | Tsunoda et al. ............ 257/341 |
| 6,140,184 | A | 10/2000 | Dupuy et al. |
| 6,614,684 | B1 | 9/2003 | Shukuri et al. |
| 6,710,405 | B2 | 3/2004 | Zommer et al. |
| 7,157,338 | B2 | 1/2007 | Zommer et al. |
| 7,569,883 | B2 * | 8/2009 | Frisina et al. ............... 257/341 |
| 2002/0093033 | A1 | 7/2002 | Zommer et al. |
| 2004/0232484 | A1* | 11/2004 | Zommer et al. ............ 257/341 |

FOREIGN PATENT DOCUMENTS

| | | | |
|---|---|---|---|
| JP | 2004-221370 | | 8/2004 |
| JP | 2004-228553 | * | 8/2004 |
| JP | 2004-363327 | | 12/2004 |

OTHER PUBLICATIONS

Official translation of the JP-2004-228553 reference.*

International Search Report and The Written Opinion corresponding to the PCT application No. PCT/JP2006/301489, date of mailing Apr. 4, 2006, 8 pages total.

Office Action of Jun. 21, 2002 for U.S. Appl. No. 09/764,545, 5 pages.

Office Action of Oct. 2, 2002 for U.S. Appl. No. 09/764,545, 5 pages.

Office Action of Dec. 2, 2002 for U.S. Appl. No. 09/764,545, 10 pages.

Office Action of May 22, 2003 for U.S. Appl. No. 09/764,545, 18 pages.

Notice of Allowance of Oct. 8, 2003 for U.S. Appl. No. 09/764,545, 4 pages.

Office Communication of Dec. 8, 2003 for U.S. Appl. No. 09/764,545, 3 pages.

Office Action of Sep. 24, 2004, for U.S. Appl. No. 10/790,983, 8 pages.

Office Action of May 19, 2005, for U.S. Appl. No. 10/790,983, 8 pages.

Office Action of Oct. 11, 2005 for U.S. Appl. No. 10/790,983, 12 pages.

Office Action of May 4, 2006 for U.S. Appl. No. 10/790,983, 5 pages.

Advisory Action of Jun. 26, 2006 for U.S. Appl. No. 10/790,983, 4 pages.

Notice of Allowance and Fee(s) Due and Notice of Allowability of Aug. 11, 2006, for U.S. Appl. No. 10/790,983, 6 pages.

Supplementary European Search Report mailed on Jun. 10, 2010 for European Patent Application No. EP 06712632, 11 pages.

Sze, S.M., "Semiconductor Devices Physics and Technology", John Wiley & Sons, USA, 1985, pp. 210-212.

* cited by examiner

SEMICONDUCTOR DEVICE

TECHNICAL FIELD

The present invention relates to an insulated gate semiconductor device having an insulated gate structure.

BACKGROUND ART

Conventionally, an insulated gate bipolar transistor (hereinafter, IGBT) has a high input impedance of a field effect transistor and a high current drive capability of a bipolar transistor, and is particularly suitably used as a power switching device.

In a semiconductor device of this type, it is necessary to improve the radiation performance in order to prevent destruction, etc. of the semiconductor device due to a thermal runaway effect. Thus, the semiconductor device is adhered to a support plate (heat sink) also serving as a radiator plate via solder or the like. Heat generated by the semiconductor device is radiated to the outside from the radiator plate via the surface of the semiconductor device and the solder or the like.

However, particularly, a power semiconductor device has many semiconductor operating regions that are formed on a single semiconductor substrate in belt forms or island forms, in order to have an increased current capacity. As a result, the center part of the semiconductor device gains the heat emitted from the peripheral part of the semiconductor device, thus cannot achieve a radiation performance favorably.

Hence, there has been developed a semiconductor device in which the emitter regions near a gate bus line formed at the center part of the semiconductor device are formed intermittently, as disclosed in Unexamined Japanese Patent Application KOKAI Publication No. 2004-228553.

DISCLOSURE OF INVENTION

Problem to be Solved By the Invention

Since the emitter regions near the gate bus line of the semiconductor device disclosed in the aforementioned Unexamined Japanese Patent Application KOKAI Publication No. 2004-228553 are formed intermittently, the center part of the semiconductor device is saved from being flowed through by a large current. However, since there is no improvement about the heat produced at the peripheral part being transmitted to the center part of the semiconductor device, there is a possibility that a thermal runaway effect might be caused depending on the operational environment.

The present invention is made in view of the above-described circumstance, and an object of the present invention is to provide a semiconductor device which does not easily produce a thermal runaway effect due to heat generation.

Means for Solving the Problem

To achieve the above object, a semiconductor device according to a first aspect of the present invention is a semiconductor device comprising:

a semiconductor base comprising a first semiconductor region having a first conductivity type, a second semiconductor region having a second conductivity type formed in a surface region of the first semiconductor region, and a third semiconductor region having the first conductivity type formed in a surface region of the second semiconductor region; and a first electrode formed on the second semiconductor region sandwiched between the first semiconductor region and the third semiconductor region, wherein: a first region, in which the third semiconductor region occupies the second semiconductor region at a first rate, is formed at a center of the semiconductor base, and a second region, in which the third semiconductor region occupies the second semiconductor region at a second rate larger than the first rate, is formed at a circumference of the semiconductor base so as to enclose the first region.

There may be a plurality of the third semiconductor region, which may be formed to be spaced from each other.

The second semiconductor region may be formed in a belt shape.

There may be a plurality of the second semiconductor region, which may be formed side by side with a space therebetween.

An impurity concentration of the second semiconductor region may be relatively high at a center part of the semiconductor base, and relatively low at a peripheral part thereof.

The first electrode may be formed on the second semiconductor region via an insulating film, and a film thickness of the insulating film may be relatively thick at a center part of the semiconductor base, and relatively thin at a peripheral part thereof.

To achieve the above object, a semiconductor device according to a second aspect of the present invention is a semiconductor device comprising a semiconductor base including a first semiconductor region having a first conductivity type, a second semiconductor region having a second conductivity type formed in a surface region of the first semiconductor region, and a third semiconductor region having the first conductivity type formed in a surface region of the second semiconductor region, wherein the third semiconductor region is formed along a first direction such that a rate at which it occupies the second semiconductor region is larger at a peripheral part of the semiconductor base than at a center part thereof, and formed along a second direction perpendicular to the first direction such that a rate at which the third semiconductor region occupies the second semiconductor region is larger at the peripheral part of the semiconductor base than at the center part thereof.

The second semiconductor region may be formed in a belt shape, and the first direction may be defined in parallel with an extending direction of the second semiconductor region.

The second semiconductor region may be formed in an island shape, and the first direction may be defined in parallel with or perpendicularly to a part of edges of the semiconductor device.

To achieve the above object, a semiconductor device according to a third aspect of the present invention is a semiconductor device comprising:

a semiconductor base comprising a first semiconductor region having a first conductivity type, a second semiconductor region having a second conductivity type formed in a surface region of the first semiconductor region, and a third semiconductor region having the first conductivity type formed in a surface region of the second semiconductor region;

an insulating film formed on the second semiconductor region sandwiched between the first semiconductor region and the third semiconductor region; and a first electrode formed on the insulating film, wherein the insulating film comprises a first region formed at a center region of the semiconductor base to have a first thickness, and a second region formed to have a second thickness thinner than the first region at a circumference of the semiconductor base so as to enclose the first region.

To achieve the above object, a semiconductor device according to a fourth aspect of the present invention is a semiconductor device comprising:

a semiconductor base comprising a first semiconductor region having a first conductivity type, a second semiconductor region having a second conductivity type formed in a surface region of the first semiconductor region, and a third semiconductor region having the first conductivity type formed in a surface region of the second semiconductor region;

an insulating film formed on the second semiconductor region sandwiched between the first semiconductor region and the third semiconductor region; and a first electrode formed on the insulating film, wherein the second semiconductor region comprises a first region formed at a center of the semiconductor base to have a first impurity concentration, and a second region formed to have a second impurity concentration lower than the first impurity concentration at a circumference of the semiconductor base so as to enclose the first region.

EFFECT OF THE INVENTION

According to the present invention, it is possible to provide a semiconductor device which does not easily produce a thermal runaway effect due to heat generation, by reducing the amount of a current in the center part of the semiconductor device and thus suppressing heat generation at the center part of the device.

Figure 1:
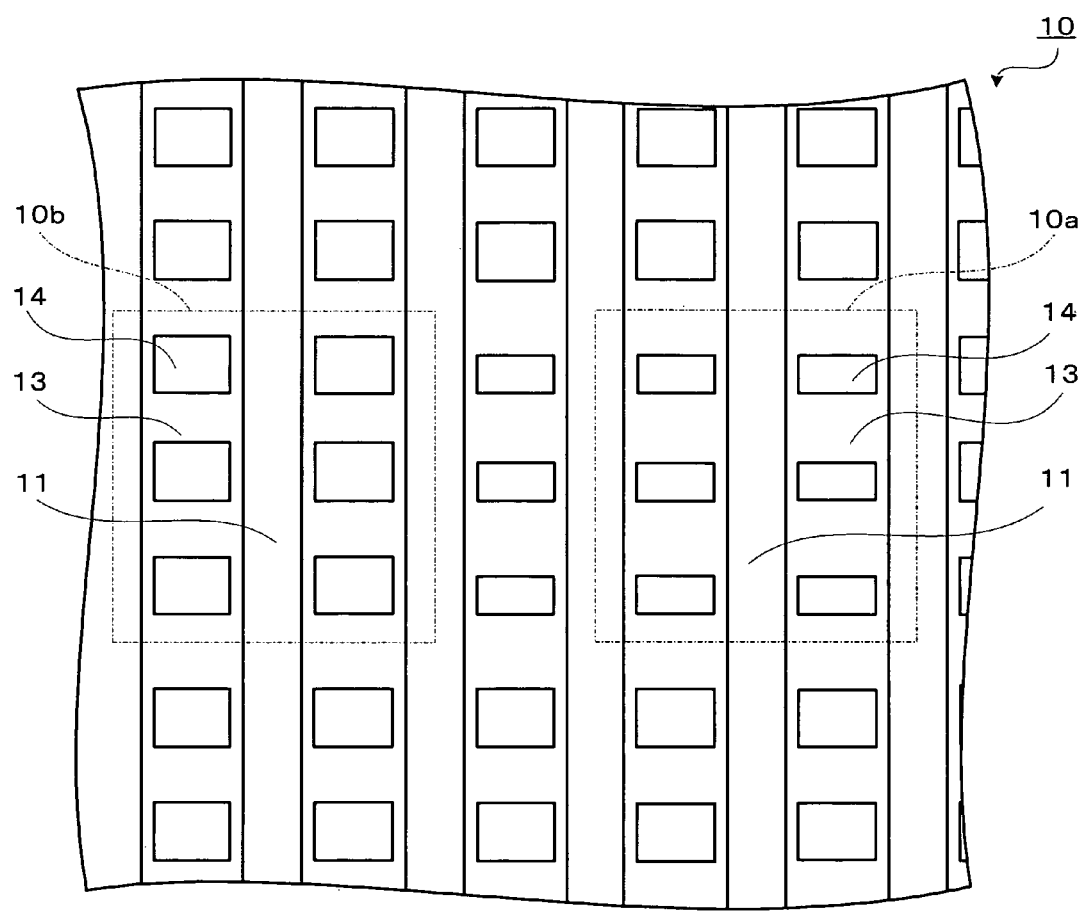
FIG. 1 It is a plan view showing an example of the structure of a semiconductor device according to a first embodiment of the present invention.

EXPLANATION OF REFERENCE NUMERALS 10, 60, 80 semiconductor device
11 N⁻ type base region
12 P⁺ type collector region
13, 83 P type base regions
14, 62 N⁺ type emitter regions
15 N type buffer region
21, 61, 81 semiconductor base
31 emitter electrode
32 collector electrode
33 gate electrodes
34, 64 gate insulating films
35 interlayer insulating films
66 protection film

BEST MODE FOR CARRYING OUT THE INVENTION

A semiconductor device according to each embodiment of the present invention will be explained with reference to the drawings.

In the present embodiment, the explanation will be made by employing, as an example, a case where an IGBT (Insulated Gate Bipolar Transistor; hereinafter, IGBT) is used as the semiconductor device.

First Embodiment

Figure 2:
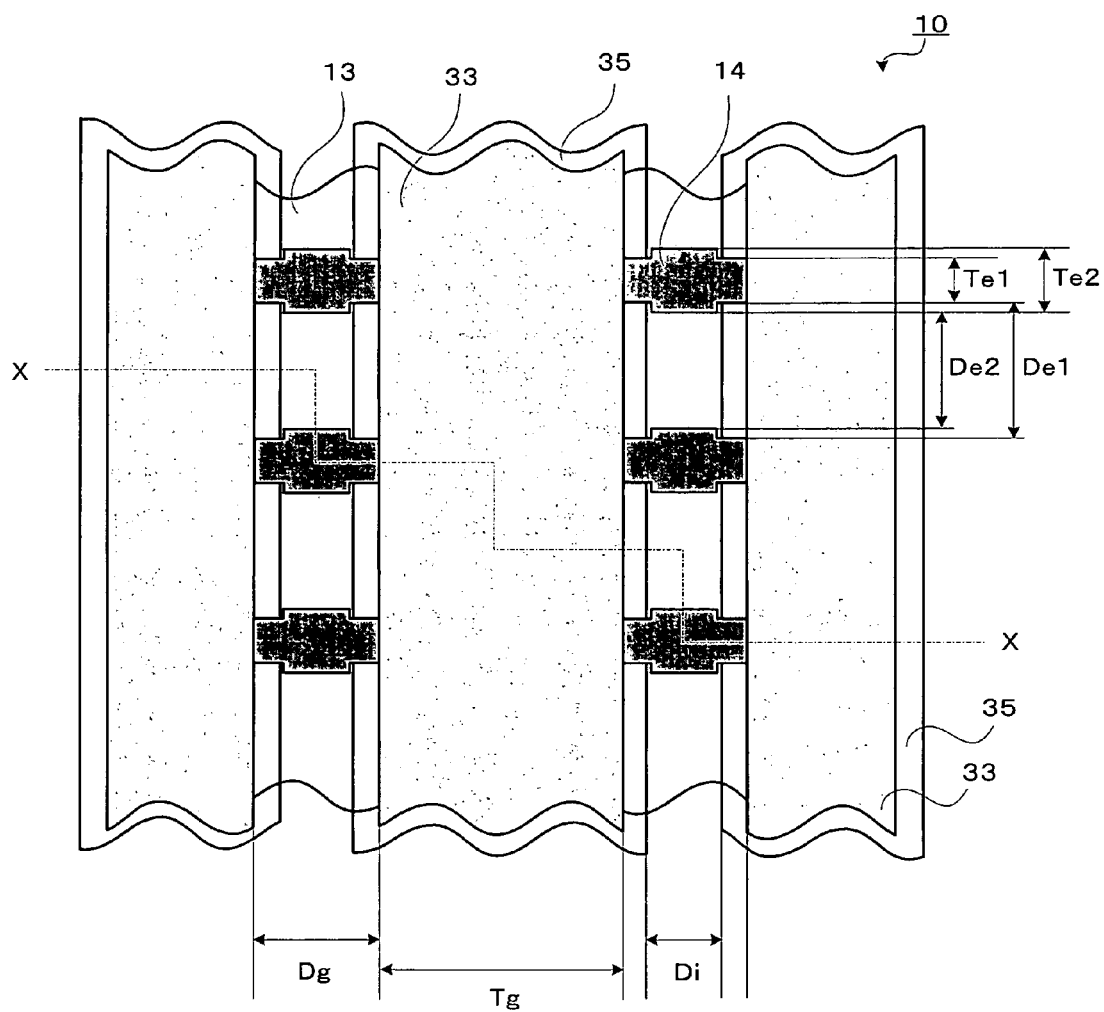
FIG. 2 It is a plan view showing an example of the structure of the center part of the semiconductor device according to the first embodiment of the present invention.
Figure 3:
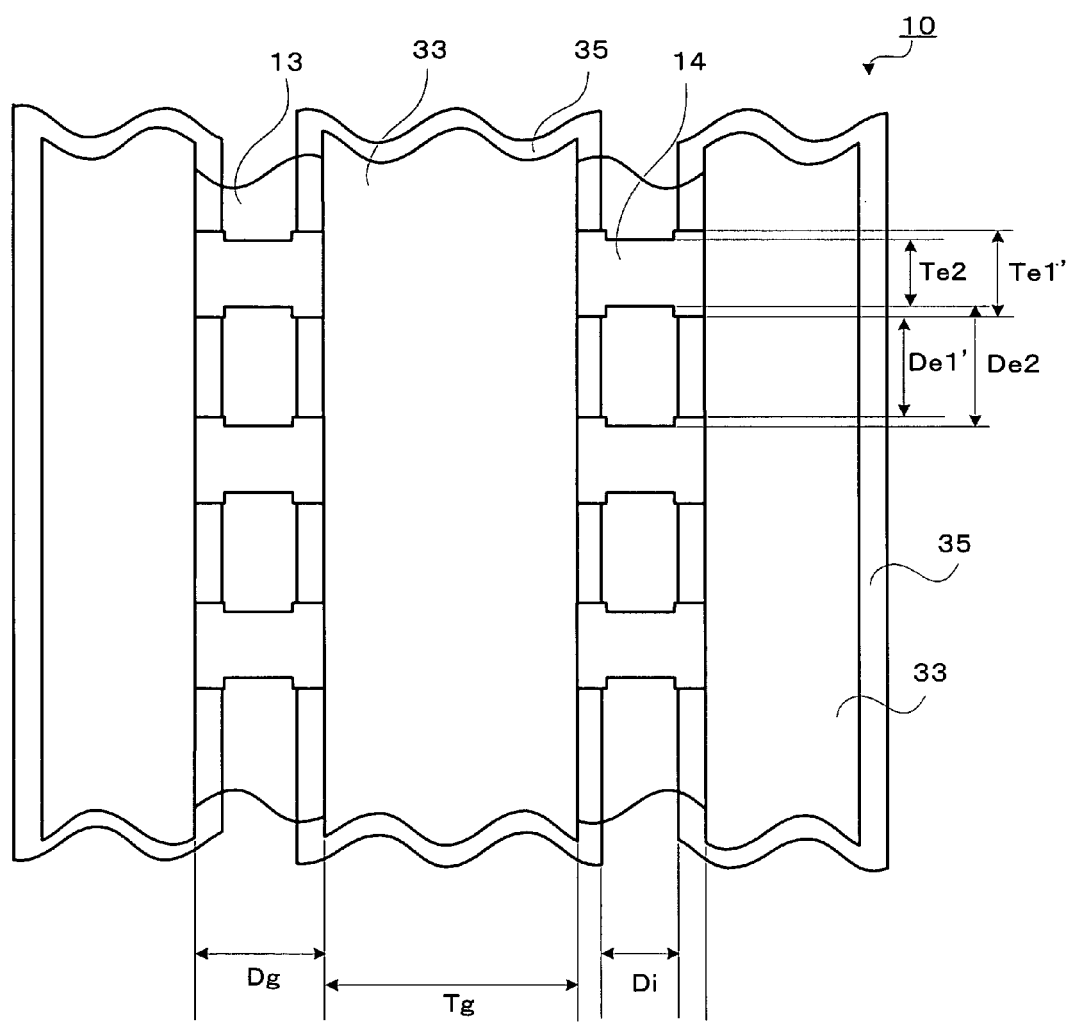
FIG. 3 It is a plan view showing an example of the structure of the peripheral part of the semiconductor device according to the first embodiment of the present invention.
Figure 4:
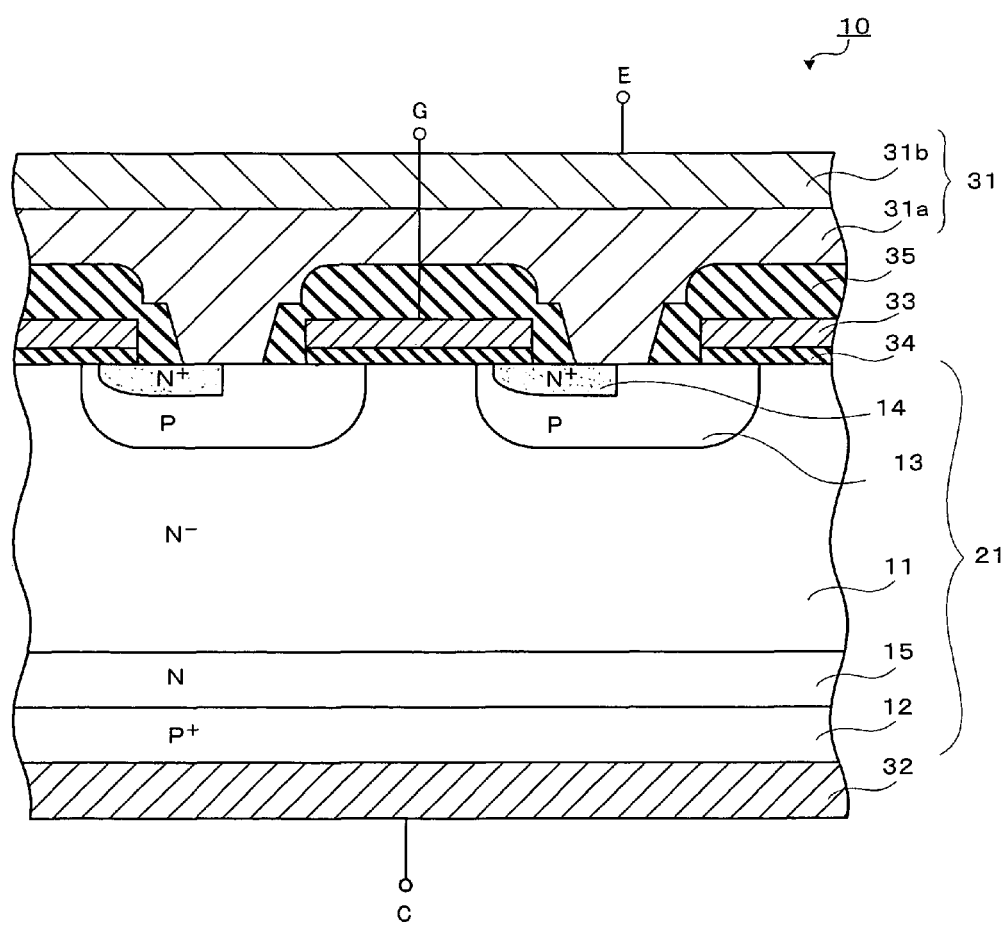
FIG. 4 It is a cross-sectional view of the semiconductor device shown in FIG. 2 as taken along X-X.

A semiconductor device 10 according to the first embodiment of the present invention is shown in FIG. 1 to FIG. 4. FIG. 1 is a plan view showing the semiconductor device 10. FIG. 2 is a plan view showing a region 10a enclosed by a dash-dotted line in the semiconductor device 10 shown in FIG. 1. FIG. 3 is a plan view showing a region 10b enclosed by a dash-dotted line in the semiconductor device 10 shown in FIG. 1. FIG. 4 is a cross-sectional view of the semiconductor device 10 shown in FIG. 2 as taken along X-X. In FIG. 1, an emitter electrode 31, gate electrodes 33, and interlayer insulating films 35 to be described later are omitted, and N⁺ type emitter regions 14 are illustrated in rectangular shapes unlike in FIG. 2 and FIG. 3, in order to make the explanation of the arrangement of the N⁺ type emitter regions 14 easy. In FIG. 2 and FIG. 3, the emitter electrode 31 to be described later is omitted.

As shown in FIG. 1 to FIG. 4, the semiconductor device 10 comprises a semiconductor base 21, an emitter electrode 31, a collector electrode 32, gate electrodes 33, gate insulating films 34, and interlayer insulating films 35. The semiconductor base 21 comprises an N⁻ type base region 11, a P⁺ type collector region 12, P type base regions 13, N⁺ type emitter regions 14, and an N type buffer region 15.

The N⁻ type base region 11 is formed of an N type semiconductor region in which an impurity of N type (first conductivity type) such as, for example, phosphorus, etc. is diffused. The N⁻ type base region 11 is formed so as to have, for example, a thickness of about 45 μm, and an impurity concentration of about $2 \times 10^{14}$ cm⁻³.

The P⁺ type collector region 12 is formed of a P type semiconductor region in which an impurity of P type (second conductivity type) such as, for example, boron, etc. is diffused, and is formed on the lower surface of the N type buffer region 15 as shown in FIG. 4. The collector electrode 32 is formed on the lower surface of the P⁺ type collector region 12.

The P+ type collector region 12 injects holes (positive holes) into the N− type base region 11 when the semiconductor device 10 is in operation, and produces conductance modulation. The P+ type collector region 12 is formed so as to have, for example, a thickness of about 200 μm, and the P type impurity concentration of the P+ type collector region 12 is formed to be higher than the impurity concentration of the P type base regions 13, to be, for example, an impurity concentration of about $4 \times 10^{18}$ cm$^{-3}$.

The P type base regions 13 are formed of a P type semiconductor region in which a P type impurity is diffused, and formed in the surface region of the N− type base region 11 as shown in FIG. 4. The P type base regions 13 are formed in belt shapes as shown in FIG. 1, and formed side by side with a space therebetween. The gate electrodes 33 are formed, via the gate insulating films 34, on the P type base regions 13 between the N− type base region 11 and the N+ type emitter regions 14. When a voltage equal to or higher than a threshold voltage is applied to the gate electrodes 33, channels are formed in the P type base regions 13. The P type base regions 13 are formed to have a thickness of, for example, about 3 μm, and the P type impurity concentration of the P type base regions 13 is formed to be lower than the P+ type collector region 12, to be, for example, an impurity concentration of about $2 \times 10^{17}$ cm$^{-3}$.

The N+ type emitter regions 14 are formed of an N type semiconductor region in which an N type impurity is diffused, and are formed in the surface region of the P type base regions 13. As shown in FIG. 4, the emitter electrode 31 is formed on the upper surface of the N+ type emitter regions 14. The N+ type emitter regions 14 are formed to have, for example a thickness of about 0.5 μm, and the N type impurity concentration of the N+ type emitter regions 14 is formed to be higher than the N− type base region 11, to be, for example, an impurity concentration of about $2 \times 10^{17}$ cm$^{-3}$.

The rate of the area occupied by the N+ type emitter region 14 in the P type base region 13 at the center part of the semiconductor base 21 is smaller than the rate of the area occupied by the N+ type emitter region 14 in the P type base region 13 at the peripheral part annually enclosing the center part.

Specifically, for example, the center part of the semiconductor device 10 is formed such that the width Te1 of the N+ type emitter region 14 under the gate electrode 33 and interlayer insulating film 35 is 3 μm, the width Te2 of the N+ type emitter region 14 under the emitter electrode 31 is 4.5 μm, the interval De1 between adjoining emitter regions under the interlayer insulating film 35 is 12 μm, and the interval De2 between adjoining N+ type emitter regions 14 under the emitter electrode 31 is 10.5 μm, as shown in FIG. 2.

On the other hand, the peripheral part of the semiconductor device 10 is formed such that the width Te1' of the N+ type emitter region 14 under the interlayer insulating film 35 is 6 μm, the width Te2 of the N+ type emitter region 14 under the emitter electrode 31 is 4.5 μm, the interval De1' between adjoining N+ type emitter regions 14 under the interlayer insulating film 35 is 9 μm, and the interval De2 between adjoining N+ type emitter regions 14 under the emitter electrode 31 is 10.5 μm, as shown in FIG. 3.

Here, in order to explain the difference in area between the N+ type emitter regions 14, an emitter thinning ratio, which is calculated by dividing the distance between adjoining N+ type emitter regions 14 by the sum of the width of the N+ type emitter region 14 and the distance between adjoining N+ type emitter regions 14, is used to that purpose. Since according to the present embodiment, the width of the N+ type emitter regions 14 under the emitter electrode 31 is formed uniform, the width of the N+ type emitter region 14 under the interlayer insulating film 35 and the width of the interval between adjoining N+ type emitter regions 14 under the interlayer insulating film 35 are to be employed.

Specifically, as the width Te1 of the N+ type emitter region 14 is 3 μm and the width De1 by which the N+ type emitter regions 14 are spaced apart is 12 μm at the center part of the semiconductor device 10 shown in FIG. 2, the emitter thinning ratio is 80%. On the other hand, as the width Te1' of the N+ type emitter region 14 is 6 μm and the width De1' by which the N+ type emitter regions 14 are spaced apart is 9 μm at the peripheral part of the semiconductor device 10 shown in FIG. 3, the emitter thinning ratio is 60%. Thus, when put in terms of emitter thinning ratio, the semiconductor device 10 of the present embodiment is formed to have an emitter thinning ratio of 80% at the center part, and an emitter thinning ratio of 60% at the peripheral part.

The N type buffer region 15 is formed of an N type semiconductor region in which an N type impurity is diffused and is formed on the upper surface of the P+ type collector region 12. The N type buffer region 15 suppresses positive holes from being injected into the N− type base region 11.

The emitter electrode 31 comprises an electrode layer 31a formed of, for example, aluminum silicon (Al—Si), and an electrode layer 31b formed of, for example, titanium nickel alloy (Ti—Ni), and is formed on the upper surface of the N+ type emitter regions 14, etc. The emitter electrode 31 and the gate electrodes 33 are insulated by the interlayer insulating films 35 made of a silicon-base film or the like. As shown in FIGS. 2 and 3, the interval between adjoining interlayer insulating films 35 is 5 μm.

The collector electrode 32 is formed of aluminum or the like, and is formed on the lower surface of the P+ type collector region 12 as shown in FIG. 4.

The gate electrodes 33 are formed of polysilicon or the like, and disposed, via the gate insulating films 34 formed of silicon-base film or the like, on the P type base regions 13 between the N− type base region 11 and the N+ type emitter regions 14, as shown in FIG. 4. The width Tg of the gate electrode 33 is 6 μm as shown in FIGS. 2 and 3. The width Dg between adjoining gate electrodes 33 is 8 μm.

When a voltage is applied to the gate electrodes 33 of the semiconductor device 10 having the above-described structure, an electric field is generated and a depletion layer is formed in the surface region of the P type base regions 13 under the gate insulating films 34. When the voltage applied becomes equal to or higher than a threshold voltage, an inversion layer (channel) is formed in the surface region of the P type base regions 13. As a result, electrons are injected into the N type base region 11 from the N+ type emitter regions 14 through the channels, and positive holes are injected into the N type base region 11 from the P+ type collector region 12. Then, currents flow between the N+ type emitter regions 14 and the P+ type collector region 12 through the channels and the N type base region 11, bringing the semiconductor device 10 into the ON state.

The semiconductor device 10 according to the first embodiment is formed in a manner that the rate of the area occupied by the N+ type emitter region 14 in the P type base region 13 at the center part of the semiconductor device 10 is smaller than the rate of the area occupied by the N+ type emitter region 14 in the P type base region 13 at the peripheral part thereof. Accordingly, when the semiconductor device 10 is in the ON state, the current flowing in the center part of the semiconductor device 10 is smaller than in the peripheral part, and less heat is generated at the center part than at the peripheral part. As a result, even when the heat generated at the center part is joined by heat generated at the peripheral part and transmitted thereto, the center part of the semiconductor device 10 is less likely to cause a thermal runaway effect.

Figure 6:
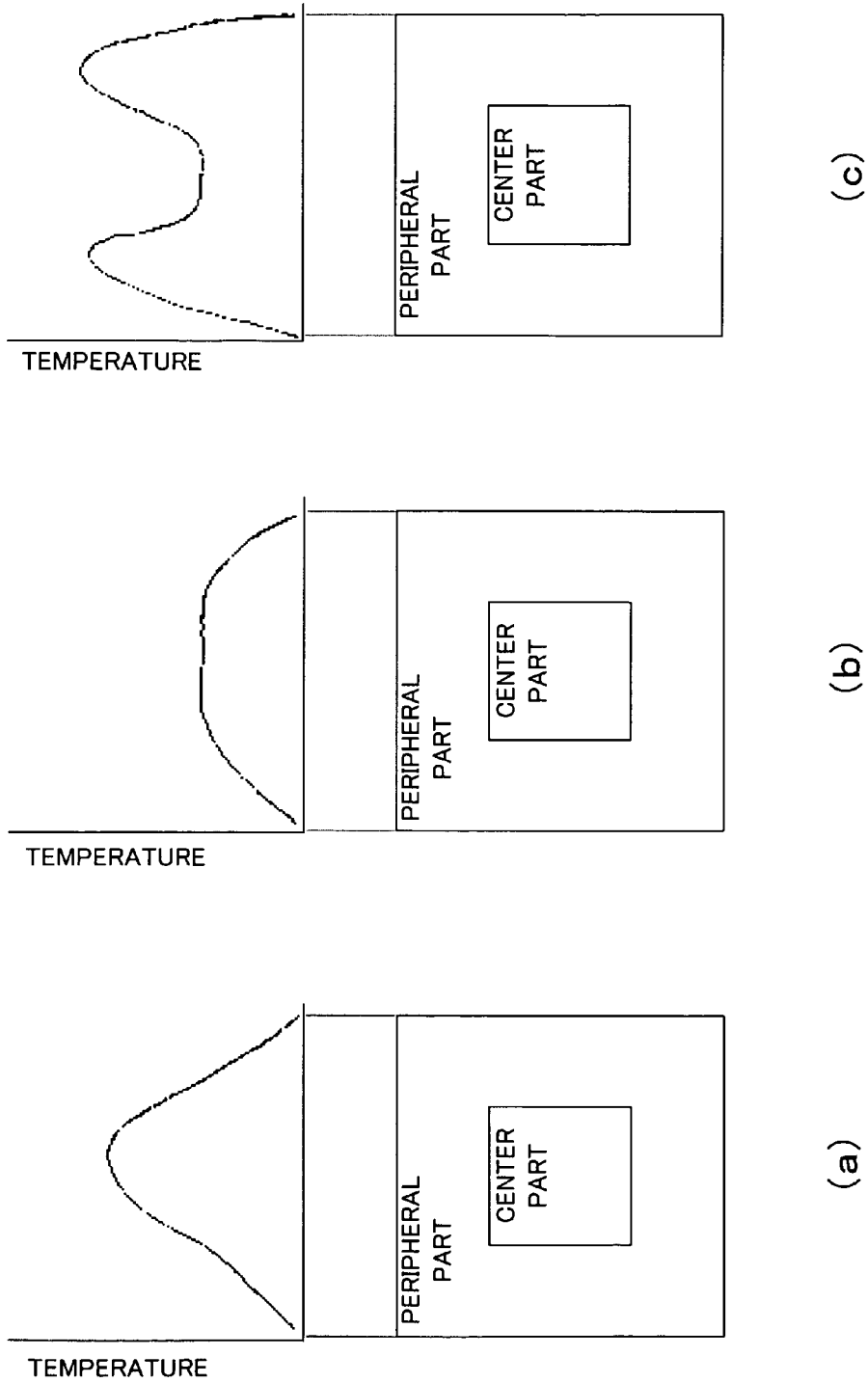
FIG. 6 These are diagrams showing the temperature distributions in the semiconductor base in a case where the emitter thinning ratio is changed.

For example, the temperature distributions in the semiconductor base of the semiconductor device in a case where the emitter thinning ratio at the peripheral part of the semiconductor device is 60% and the emitter thinning ratio at the center part is changed among 60%, 80%, and 100% are shown in FIGS. 6(a) to (c).

In the case where the emitter thinning ratio is 60% (no variation in the thinning ratio), a favorable heat radiation does not occur at the center part of the semiconductor device because the heat generated at the peripheral part joins the heat generated at the center part of the semiconductor device, whereby the temperature increases from the periphery of the semiconductor device to the center thereof, as shown in FIG. 6(a). In this case, it is easier for a thermal runaway effect to occur at the center part of the semiconductor device.

On the other hand, in a case where the emitter thinning ratio is 100%, since no heat is generated at the center part of the semiconductor device, heat does not concentrate at the center part of the semiconductor device, but the temperature gets high only at the peripheral part of the semiconductor device as shown in FIG. 6(c). However, since the semiconductor device having the emitter thinning ratio of 100% needs to have the emitter regions at the peripheral part be formed to have an area rate larger than in case of the emitter thinning ratio being 60% in order to secure a current capacity equivalent to that in case of the emitter thinning ratio being 60% or 80%, heat generation is increased particularly at the peripheral part.

As compared to this, in case of the emitter thinning ratio being 80%, the temperature does increase from the peripheral part of the semiconductor device to the center thereof, as shown in FIG. 6(b). However, since there is little heat generated at the center part of the semiconductor device, the center part does not prominently get heated even if heat is transmitted from the peripheral part. Accordingly, the center part of the semiconductor device 10 does not receive heat concentration, making it possible to prevent the semiconductor device 10 from a thermal runaway effect.

Further, since the semiconductor device according to the present embodiment has the rate of the area occupied by the N+ type emitter region 14 in the P type base region 13 reduced only at the center part where heat concentrates in particular, the peripheral part where heat does not concentrate keeps its current amount, and the semiconductor device 10 can be prevented from a drop of its current capacity on the whole.

As explained above, according to the present embodiment, by varying the area of and interval between the N+ type emitter regions 14 running along the extending direction of the P type base regions 13 between the center part of the semiconductor device 10 and the peripheral part enclosing this, the emitter thinning ratio at the center part of the device is made larger than the emitter thinning ratio at the peripheral part of the device. That is, the rate of the area occupied by the N+ type emitter region 14 in the P type base region 13 is larger at the peripheral part of the device than at the center part of the device.

However, the manner of varying the rate of the area occupied by the N+ type emitter region 14 in the P type base region 13 between the center part of the device and the peripheral part of the device is not limited to varying the area of and interval between the N+ type emitter regions 14 running along the extending direction of the P type base regions 13. For example, the rate of the area occupied by the N+ type emitter region 14 in the P type base region 13 may be made larger at the peripheral part of the device than at the center part of the device, by varying only either the area of or interval between the N+ type emitter regions 14 running in the extending direction of the P type base regions 13.

Further, only either the area of or interval between the N+ type emitter regions 14 may be varied along the aforementioned extending direction between the center part and end parts of the direction, while also the interval Tg between the P type base regions 13 in the direction perpendicular to the aforementioned extending direction may be varied between the center part of the device and the peripheral part of the device.

That is, in a case where the N+ type emitter regions 14 are formed in the surface region of the P type base regions 13 having a belt shape, the rate of the area occupied by the N+ type emitter region 14 in the P type base region 13 may be varied along the extending direction of the P type base region 13 such that it becomes larger at the center part of the device than at the peripheral part of the device, and the rate of that area of the N+ type emitter region 14 may also be varied along the direction perpendicular to the extending direction such that it becomes larger at the center part of the device than at the peripheral part of the device.

Also in a case where the N+ type emitter regions are formed in the surface region of the P type base regions having an island shape, the rate of the area occupied by the N+ type emitter region in the P type base region may be varied along a first direction such that it becomes larger at the center part of the device than at the peripheral part of the device, and the rate of that area of the N+ type emitter region may also be varied along a second direction perpendicular to the first direction such that it becomes larger at the center part of the device than at the peripheral part of the device. In this case, the first direction can be defined as a direction parallel with or perpendicular to one side or one part of the edges of the semiconductor device.

Figure 5:
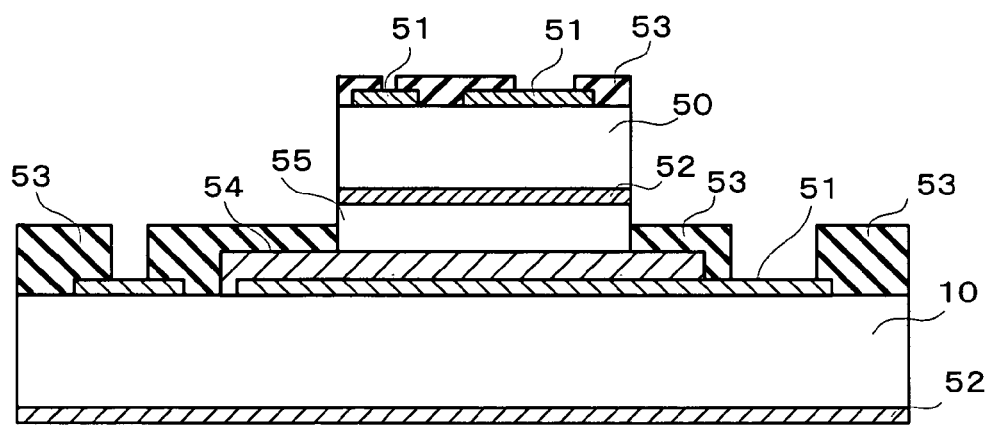
FIG. 5 It is a cross-sectional view showing the structure of a dual-stacked semiconductor device.

The semiconductor device 10 according to the present invention is particularly effective for a conventional integration structure, for example, in a case where the semiconductor has a dual-layer structure as shown in FIG. 5. This is the case where, for example, a semiconductor device 50 is mounted on the semiconductor device 10 according to the present embodiment as shown in FIG. 5. A front surface electrode 51 and rear surface electrode 52 formed of aluminum films or the like, a protection film 53 formed of, for example, silicon dioxide ($SiO_2$), a soldered electrode 54, and a chip bonding agent 55 are formed between the semiconductor device 10 and the semiconductor device 50. The semiconductor device 50 is arranged on the center of the semiconductor device 10, i.e., on the upper surface of a first region where the rate of the area occupied by the N+ type emitter region 14 in the P type base region 13 is smaller.

In such an assembly structure, the heat generated from the semiconductor device 50 mounted on the top is transmitted to the center part of the semiconductor device 10 through the rear surface electrode 52, the chip bonding member 55, the soldered electrode 54, and the front surface electrode 51. Due to this, the heat generated from the semiconductor device 10 itself and the heat transmitted from the semiconductor device 50 add up to make a thermal runaway effect more probable than in a case where the semiconductor device 10 operates solely.

The semiconductor device 10 of the present invention has the rate of the area occupied by the emitter region in the base region reduced at the center part of the device and has the semiconductor device 50 arranged on the top surface thereof, thereby enabling itself to suppress heat concentration at the center part of semiconductor device 10 and to prevent a thermal runaway effect favorably.

According to the present invention, not only the heat radiation performance of the semiconductor device is enhanced, but also an effective means can be provided as a method for improving the resistance of F-ASO, etc. having an intimate relation with heat generation and heat radiation.

Second Embodiment

A semiconductor device according to the second embodiment of the present invention will be explained with reference to the drawings. The difference between the semiconductor device of the present embodiment and the semiconductor device of the first embodiment lies in that the emitter regions are formed to have almost the same area at the peripheral part and the center part, but the thickness of the gate insulating films is varied between the peripheral part and center part of the device. The parts that are common with the semiconductor device of the first embodiment are given the same reference numerals, and a detailed explanation thereof will be omitted.

Figure 7:
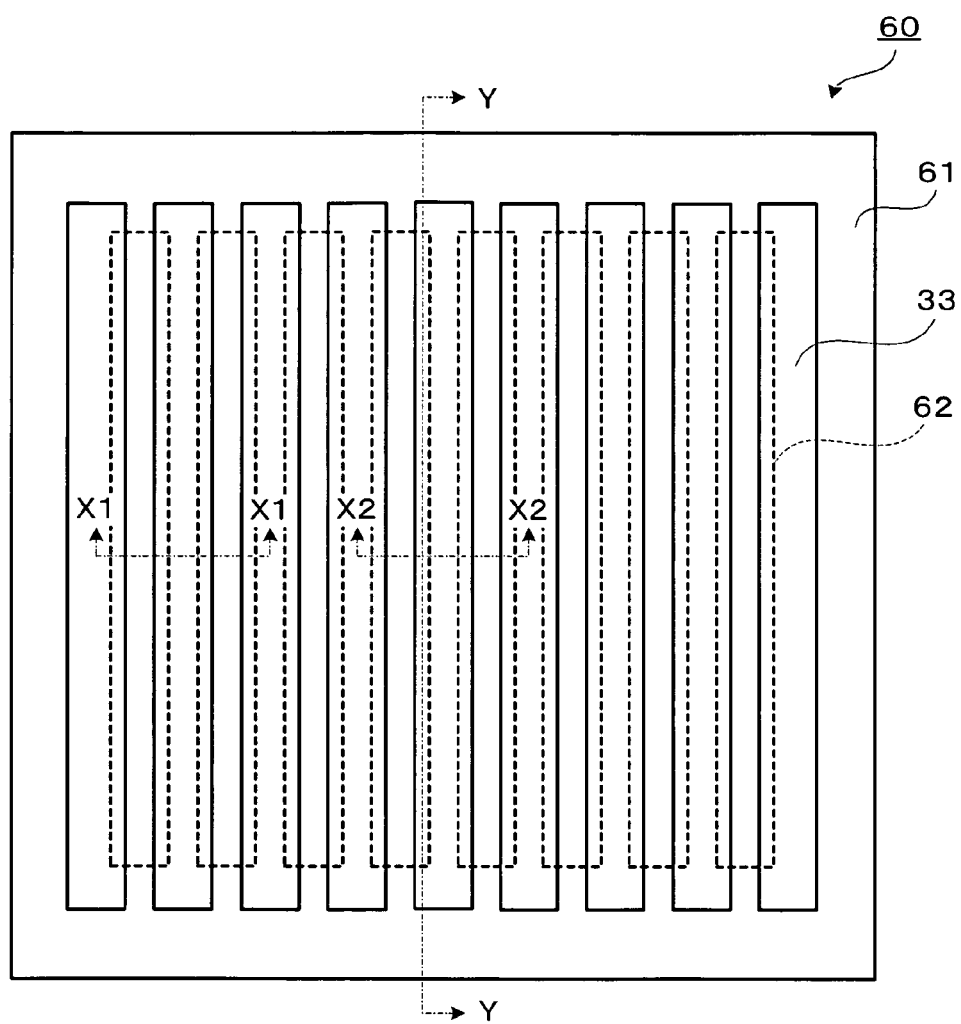
FIG. 7 It is a plan view an example of the structure of a semiconductor device according to a second embodiment of the present invention.
Figure 8:
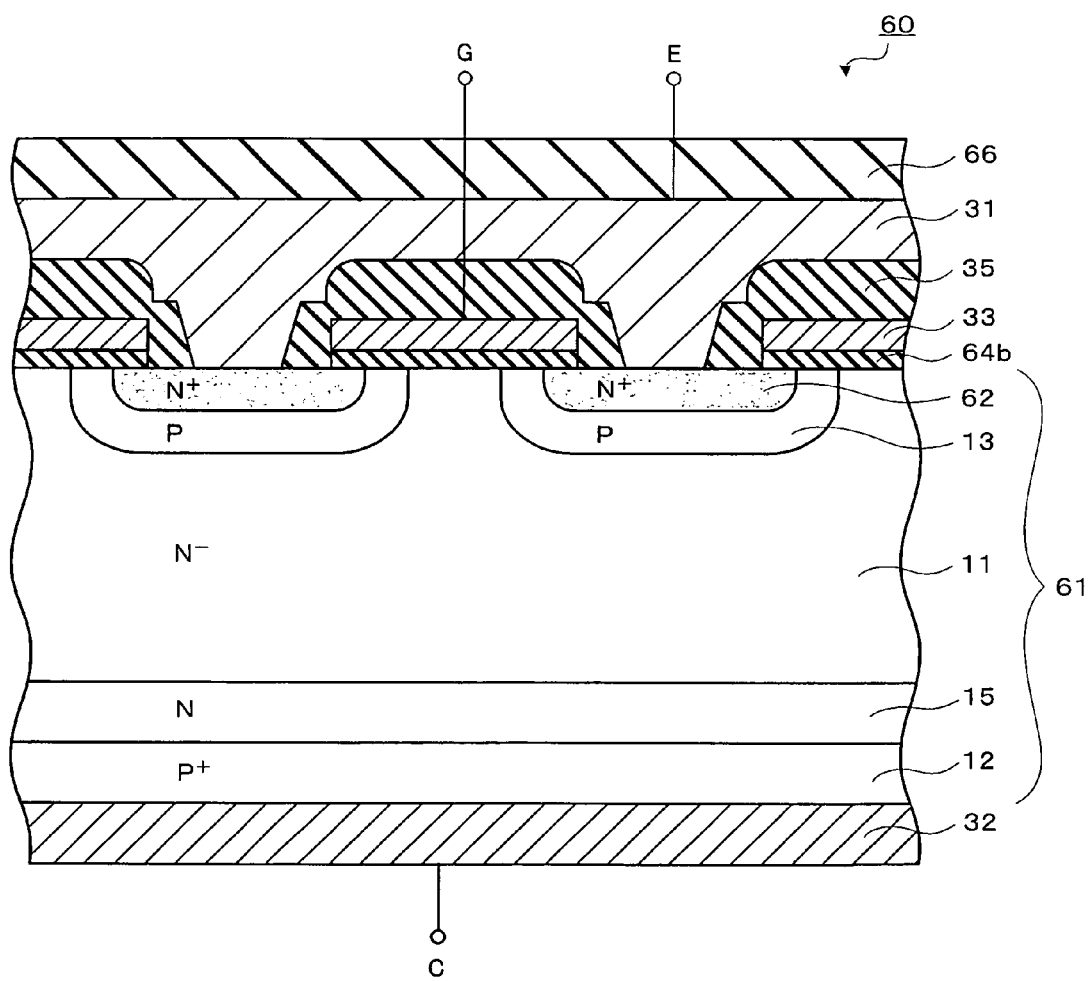
FIG. 8 It is a cross-sectional view of the semiconductor device shown in FIG. 7 as taken along a line X1-X1.
Figure 9:
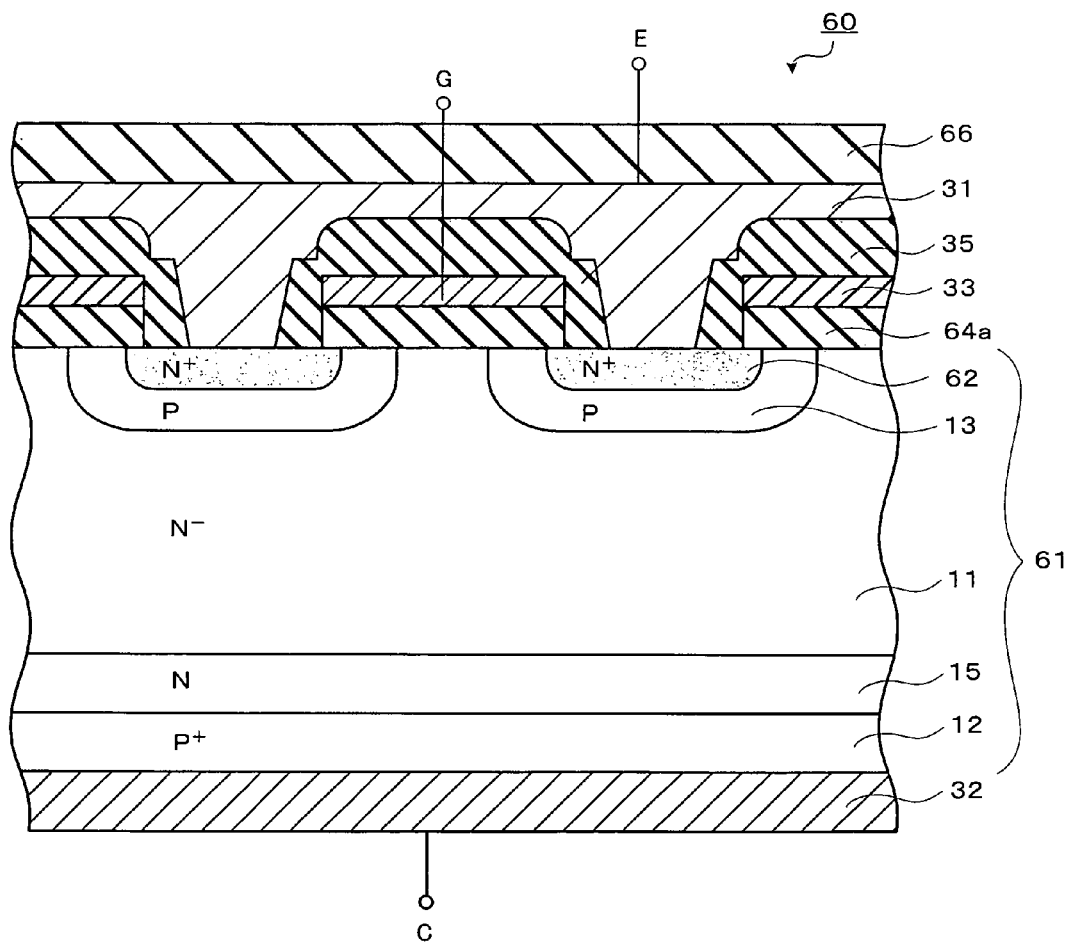
FIG. 9 It is a cross-sectional view of the semiconductor device shown in FIG. 7 as taken along a line X2-X2.
Figure 10:
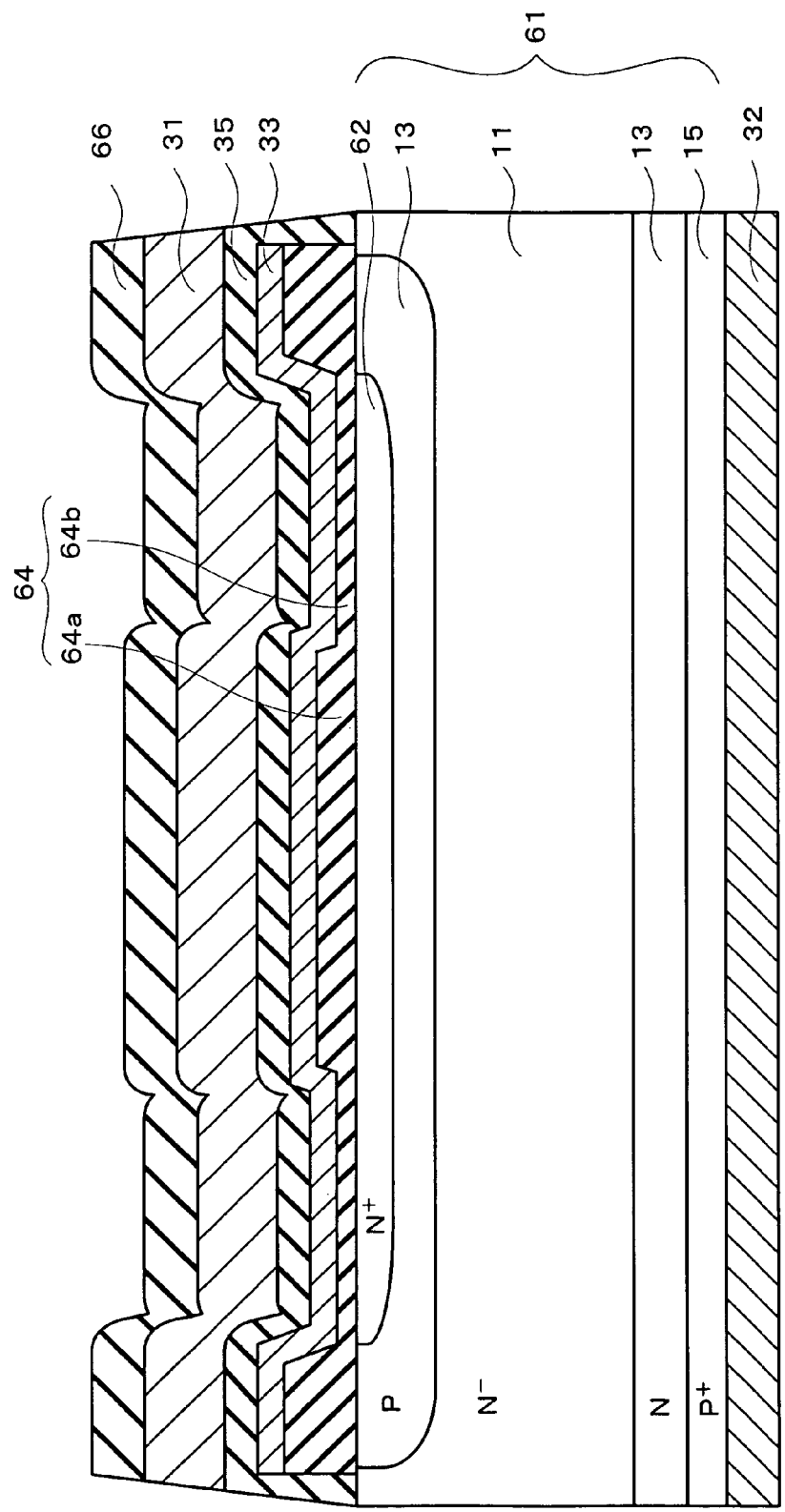
FIG. 10 It is a cross-sectional view of the semiconductor device shown in FIG. 7 as taken along a line Y-Y.

The semiconductor device 60 according to the present embodiment is shown in FIG. 7 to FIG. 10. FIG. 7 is a plan view showing an example of the structure of the semiconductor device 60. FIG. 8 is a cross-sectional view of the semiconductor device 60 shown in FIG. 7 as taken along a line X1-X1, and FIG. 9 is a cross-sectional view as taken along a line X2-X2. FIG. 10 is a cross-sectional view of the semiconductor device 60 shown in FIG. 7 as taken along a line Y-Y. Note that only a semiconductor device 61, gate electrodes 33, and $N^+$ type emitter regions 62 are shown in FIG. 7, for explanatory convenience.

As shown in FIG. 7 to FIG. 10, the semiconductor device 60 comprises a semiconductor base 61, an emitter electrode 31, a collector electrode 32, gate electrodes 33, interlayer insulating films 35, gate insulating films 64, and a protection film 66. The semiconductor base 61 comprises an $N^-$ type base region 11, a $P^+$ type collector region 12, P type base regions 13, $N^+$ type emitter regions 62, and an N type buffer region 15.

The $N^-$ type base region 11 is formed of an N type semiconductor region in which an impurity of N type (first conductivity type), for example, phosphorus or the like is diffused.

The $P^+$ type collector region 12 is formed of a P type semiconductor region in which an impurity of P type (second conductivity type), for example, boron or the like is diffused, and is formed on the lower surface of the N type buffer region 15 as shown in FIG. 8. The collector electrode 32 is formed on the lower surface of the $P^+$ type collector region 12.

The P type base regions 13 are formed of a P type semiconductor region in which an impurity of P type is diffused, and are formed in the surface region of the $N^-$ type base region 11 as shown in FIG. 8 and FIG. 9. The P type base regions 13 are formed in belt shapes as shown in FIGS. 8 to 10, and formed side by side with a space therebetween. When a voltage equal to or higher than a threshold voltage is applied to the gate electrodes 33, channels are formed in the P type base regions 13.

The N type buffer region 15 is formed of an N type semiconductor region in which an impurity of N type is diffused, and is formed on the upper surface of the $P^+$ type collector region 12. The N type buffer region 15 suppresses positive holes from being injected into the $N^-$ type base region 11.

The $N^+$ type emitter regions 62 are formed of an N type semiconductor region in which an impurity of N type is diffused, and are formed in the surface region of the P type base regions 13. As shown in FIG. 7, the $N^+$ type emitter regions 62 are formed in belt shapes, and formed side by side with a space therebetween. In this way, the $N^+$ type emitter regions 62 of the present embodiment are formed to have areas almost equal between the center part and peripheral part of the semiconductor device 60, unlike the first embodiment.

The emitter electrode 31 is formed of aluminum or the like, and is formed on the upper surface of the $N^+$ type emitter regions 62, etc. The emitter electrode 31 and the gate electrodes 33 are insulated by the interlayer insulating films 35 formed of a silicon-base film or the like. Likewise the first embodiment, an opening may be formed at the center of the $N^+$ type emitter regions 62, and the P type base regions 13 may be connected to the emitter electrode 31 via the openings.

The collector electrode 32 is formed of aluminum or the like, and formed on the lower surface of the $P^+$ type collector region 12.

The gate electrodes 33 are formed of polysilicon or the like, and arranged, via the gate insulating films 64 formed of a silicon-base film or the like, on the P type base regions 13 between the $N^-$ type base region 11 and the $N^+$ type emitter regions 62 as shown in FIG. 8 and FIG. 9.

The protection film 66 is formed of, for example, polyimide, and formed on the upper surface of the emitter electrode 31 as shown in FIGS. 8 to 10.

The gate insulating films 64 are formed of an insulating material, for example, silicon dioxide ($SiO_2$) or the like, and comprise a gate insulating film 64a formed at the center part of the semiconductor device 60 and a gate insulating film 64b formed at the peripheral part thereof as shown in FIG. 10. For example, the gate insulating film 64a is formed to have a thickness of about 1000 Å, and the gate insulating film 64b is formed to have a thickness of about 500 Å. By forming the gate insulating films 64 to be thick at the center part and thin at the peripheral part in this manner, it is possible to raise the threshold voltage at the center part of the semiconductor device 60, and it becomes harder at the center part of the semiconductor device than at the peripheral part thereof for the P type base regions 13 to be inverted into N type when a voltage is applied to the gate electrodes 33, making it harder for channels to be formed. Accordingly, it is possible to make the current flowing in the center part of the semiconductor device 60 smaller than the current flowing in the peripheral part. As a result, the heat to be generated at the center part of the semiconductor device 60 can be reduced. It is advisable that the thickness of the gate insulating film 64a be 1.5 to 3.0 times as large as the thickness of the gate insulating film 64b so that the threshold at the center part of the semiconductor device 60 may be raised and a desired current capacity may be obtained.

As described above, according to the semiconductor device 60 of the present embodiment, it is possible to reduce the amount of heat generation at the center part of the semiconductor device 60 as compared to at the peripheral part, by forming the gate insulating films 64 to have thicknesses larger at the center part of the semiconductor device 60 and smaller at the peripheral part. Accordingly, it is possible to prevent heat concentration at the center part of the semiconductor device 60 due to heat being transmitted from the peripheral part, etc., and to prevent the semiconductor device from being broken by a thermal runaway effect.

Third Embodiment

A semiconductor device 80 according to the third embodiment of the present invention will be explained with reference to the drawings. The difference between the semiconductor device 80 of the present embodiment and the semiconductor devices of the first embodiment and the second embodiment lies in that the area of the emitter regions and the thickness of the gate insulating films are formed to be equal between the center part and peripheral part of the semiconductor device, but the impurity concentration under the gate insulating films is varied between the center part and peripheral part of the semiconductor device. The parts that are common with the semiconductor devices of the first embodiment and the second embodiment are given the same reference numerals, and a detailed explanation thereof will be omitted.

Figure 11:
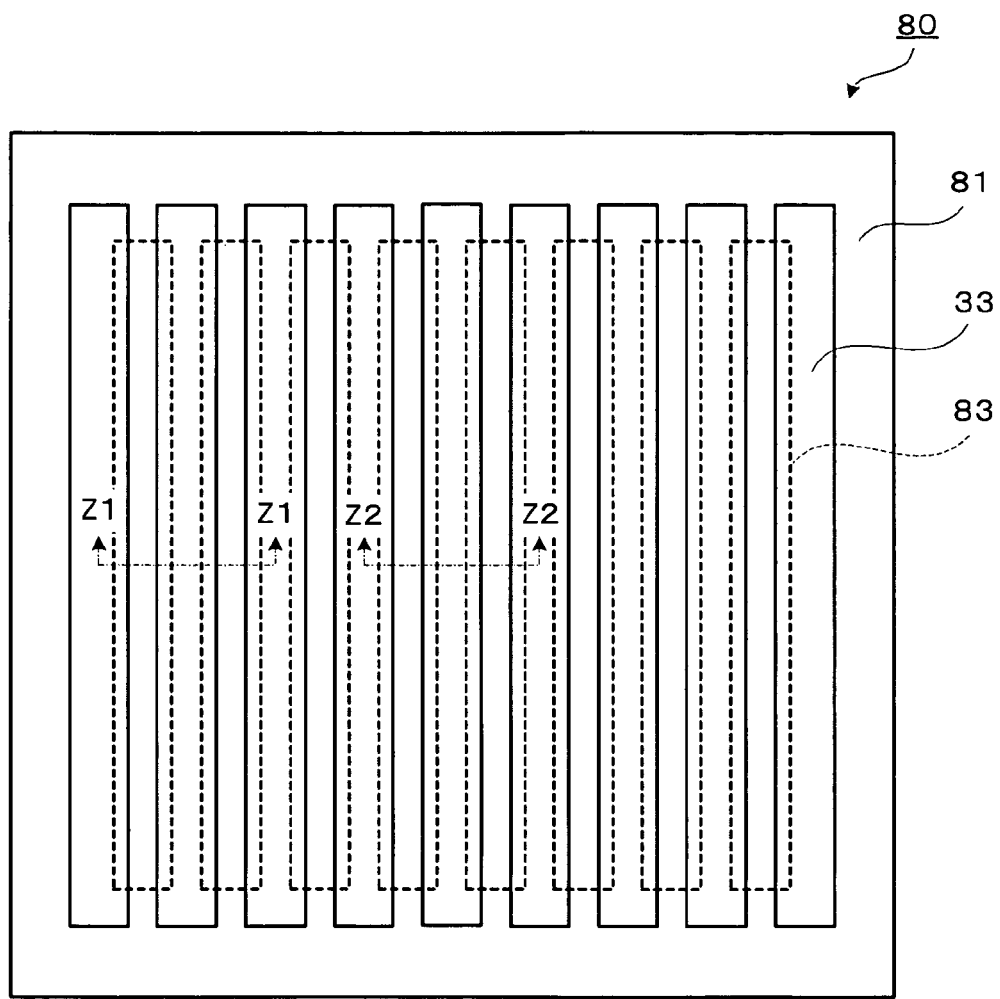
FIG. 11 It is a plan view showing an example of the structure of a semiconductor device according to a third embodiment of the present invention.
Figure 12:
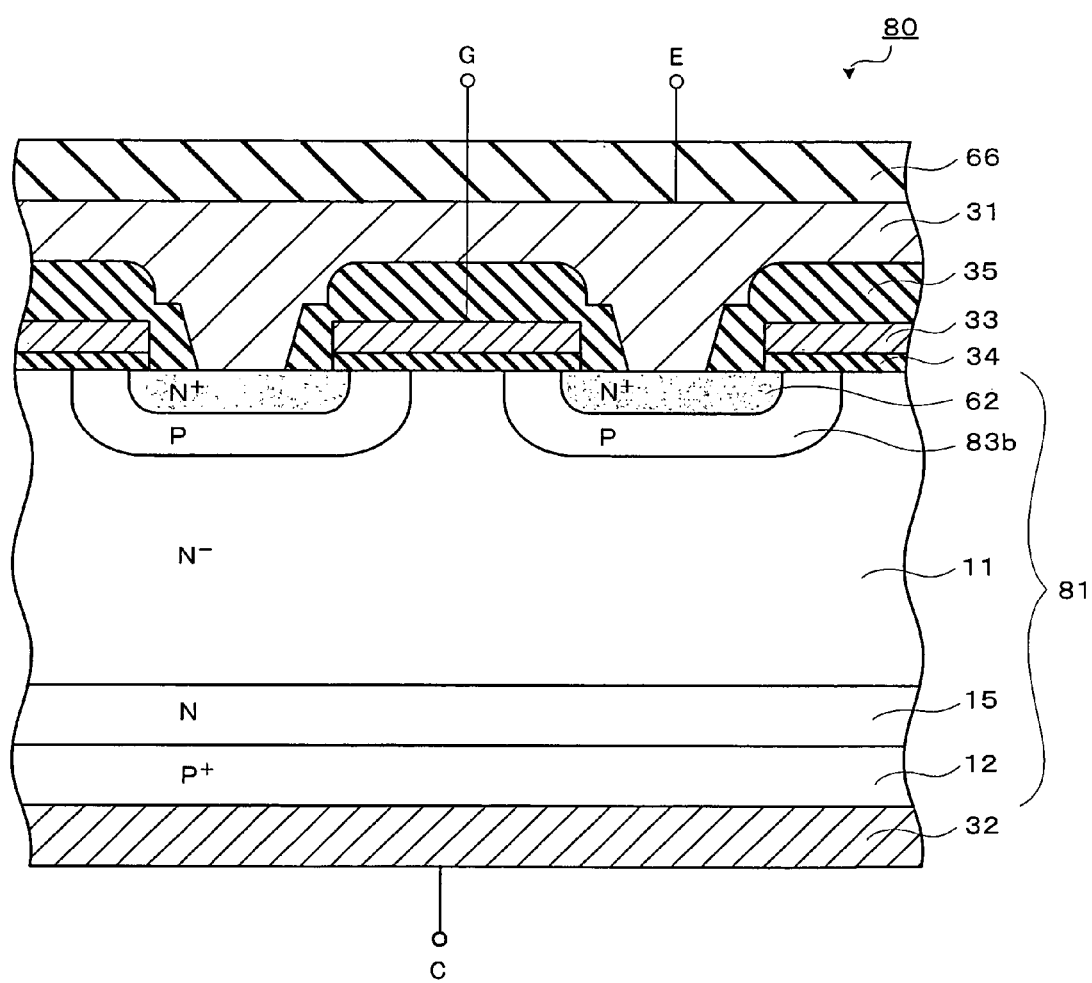
FIG. 12 It is a cross-sectional view of the semiconductor device shown in FIG. 11 as taken along a line Z1-Z1.
Figure 13:
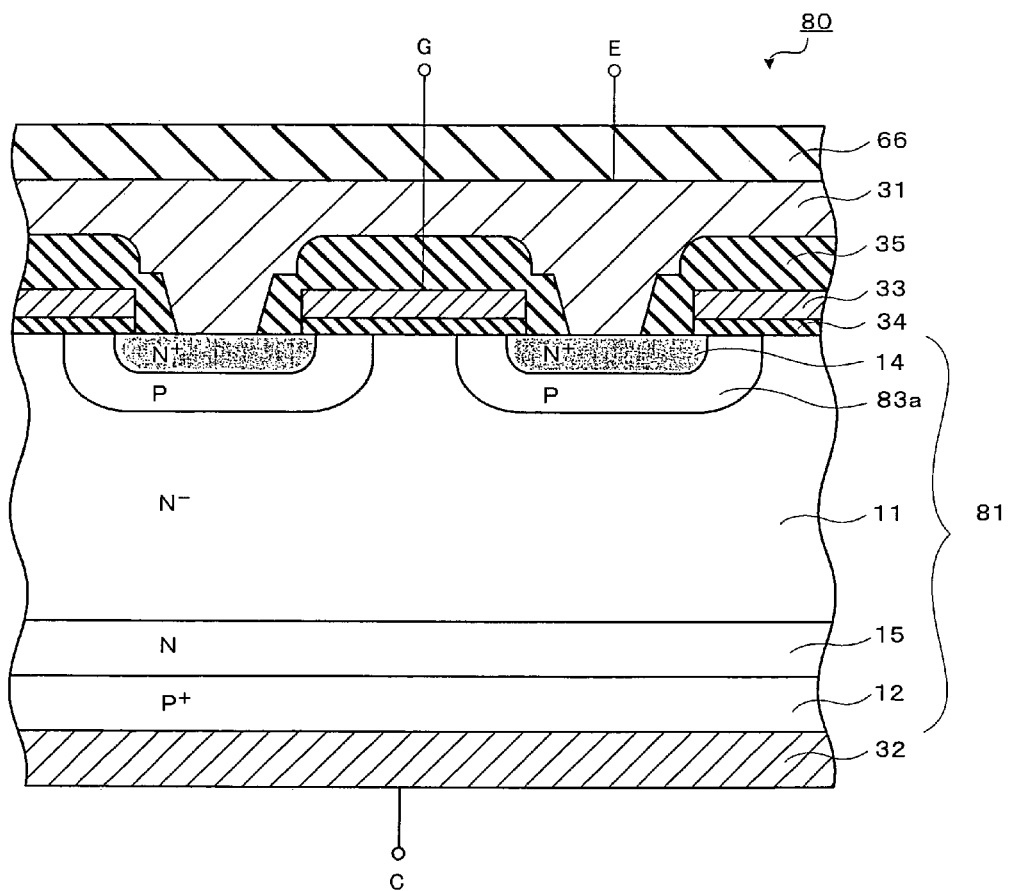
FIG. 13 It is a cross-sectional view of the semiconductor device shown in FIG. 11 as taken along a line Z2-Z2.

The semiconductor device 80 according to the present embodiment is shown in FIGS. 11 to 13. FIG. 11 is a plan view showing an example of the structure of the semiconductor device 80. FIG. 12 is a cross-sectional view of FIG. 11 as taken along a line Z1-Z1, and FIG. 13 is a cross-sectional view of the semiconductor device 80 shown in FIG. 11 as taken along a line Z2-Z2. Note that only a semiconductor base 81, gate electrodes 33, and P type base regions 83 are shown in FIG. 11, for explanatory convenience.

As shown in FIG. 11 to FIG. 13, the semiconductor device 83 comprises a semiconductor base 81, an emitter electrode 31, a collector electrode 32, gate electrodes 33, gate insulating films 34, interlayer insulating films 35, and a protection film 66. The semiconductor base 81 comprises an N$^-$ type base region 11, a P$^+$ type collector region 12, P type base regions 83, N$^+$ type emitter-regions 62, and an N type buffer region 15.

The P type base regions 83 are formed of a P type semiconductor region in which an impurity of P type is diffused, and formed in the surface region of the N$^-$ type base region 11 as shown in FIGS. 12 and 13. The P type base regions 83 of the present embodiment comprise a base region 83a formed at the center part of the semiconductor device 80 and formed to have a relatively high impurity concentration, and a base region 83b formed at the peripheral part of the semiconductor device 80 and formed to have a relatively low impurity concentration. The impurity concentration of the base region 83a is formed to be, for example, about $8 \times 10^{17}$ cm$^{-3}$, and the impurity concentration of the base region 83b is formed to be about $5 \times 10^{17}$ cm$^{-3}$. The base regions 83a and 83b only differ in the impurity concentration, and are formed to have almost the same area, thickness, etc. at the center part and peripheral part of the semiconductor device 80 as shown in FIG. 12 and FIG. 13. It is advisable that the impurity concentration of the base region 83a be formed 1.2 to 1.8 times as high as the impurity concentration of the base region 83b, in order that the threshold at the center part of the semiconductor device 80 may be raised and a desired current capacity may be obtained.

Varying the impurity concentration of the P type base regions 83 between the center part and peripheral part of the semiconductor device 80 in this manner makes it hard for an inversion layer to be formed at the center part of the semiconductor device 80 unlike at the peripheral part when equal voltages are applied to the gate electrodes 33. In other words, since the amount of the current in the center part of the semiconductor device 80 is reduced, heat generation at the center part of the semiconductor device 80 can be decreased. Accordingly, it is possible to prevent heat concentration at the center part of the semiconductor device 80 and to prevent the device from being broken due to a thermal runaway effect.

The N$^+$ type emitter regions 62 are formed of an N type semiconductor region in which an impurity of N type is diffused, and formed in the surface region of the P type base regions 83. The N$^+$ type emitter regions 62 are formed in belt shapes likewise in the second embodiment, formed side by side with a space therebetween, and formed to have areas almost equal between the center part and peripheral part of the semiconductor device 80.

The gate insulating films 34 are formed to have the same thickness at the center part and peripheral part of the semiconductor device 80 as shown in FIGS. 12 and 13, unlike in the second embodiment.

As described above, by forming the semiconductor device 80 of the present embodiment such that the impurity concentration of the P type base regions 83 is high at the center part of the device and low at the peripheral part of the device, it becomes hard for the P type base regions 83 at the center part of the device to be inverted into N type, in other words, for a current to flow in the center part, when a voltage is applied to the gate electrodes 33. Accordingly, heat is less likely to be generated in the center part of the semiconductor device 80 than in the peripheral part thereof. As a result, it is possible to prevent occurrence of a thermal runaway effect triggered by heat concentration due to heat being transmitted to the center part of the semiconductor device 80 from the peripheral part.

The present invention is not limited to the embodiments respectively described above, but can be modified and applied in various manners. For example, the above-described first embodiment was explained by employing, as an example, the case where the emitter thinning ratio is 80% at the center part and 60% at the peripheral part. However, the emitter thinning ratio is not limited to this, but can be changed in accordance with the performance required of the semiconductor device as completed, operation environment, etc. For example, it is possible that the emitter thinning ratio be 70% to 90% at the center part, and 40% to 60% at the peripheral part. Further, not only the emitter thinning ratio is varied between the peripheral part and the center part by two steps, but such a configuration may be employed, in which the emitter thinning ratio is varied between the center part and peripheral part of the semiconductor device by a few steps.

Further, likewise, the above-described second embodiment was explained by employing, as an example, the case where the thickness of the gate insulating films is varied by two steps. However, this is not the only case, but the thickness may be varied by three or more steps. Likewise in the third embodiment, the impurity concentration of the P type base regions may not only be varied by two steps, but also be varied by three steps or more.

Each of the above-described embodiments was explained by employing, as an example, a case where the configuration in which the emitter thinning ratio is varied between the center part and peripheral part of the semiconductor device, the configuration in which the thickness of the gate insulating films is varied between the center part and peripheral part of the semiconductor device, and the configuration in which the impurity concentration of the P type base regions is varied between the center part and peripheral part of the semiconductor device are implemented independently. However, not to be limited to this, these may be appropriately combined in accordance with the performance required of the semiconductor device.

This application claims priority to Japanese Patent Application No. 2005-34881 filed on Feb. 10, 2005 and Japanese Patent Application No. 2005-293802 filed on Oct. 6, 2005.

The disclosures of the specification, claims, summary, and drawings of these applications are incorporated herein by reference.

INDUSTRIAL APPLICABILITY

The present invention can be applied to a semiconductor device such as IGBT, MOSFET (Metal Oxide Semiconductor Field Effect Transistor), etc. in which unit cells are repetitively arranged. Further, the present invention can also be applied to a semiconductor device of an inverse conductivity type.

The invention claimed is:

1. A semiconductor device, comprising:
   a semiconductor base comprising a plurality of first semiconductor regions having a first conductivity type, a plurality of second semiconductor regions having a second conductivity type formed in a specific surface portion of said first semiconductor regions, and a plurality of third semiconductor regions having the first conductivity type formed in a specific surface portion of said second semiconductor regions; and
   a first electrode formed directly above said second semiconductor region that is between said first semiconductor region and said third semiconductor regions,
   wherein a first region comprising a first plurality of third semiconductor regions wherein each of the third semiconductor regions is exhibiting a first top surface area is formed at a center of said semiconductor base,
   wherein a second region comprising a second plurality of third semiconductor regions wherein each of the third semiconductor regions exhibits a second top surface area larger than said first top surface area completely surrounds said first region,
   wherein a first device is mounted on the semiconductor base of the semiconductor device.

2. The semiconductor device according to claim 1, wherein said first and second plurality of third semiconductor regions are formed to be spaced from each other.

3. The semiconductor device according to claim 1, wherein said plurality of second semiconductor regions are formed in a belt shape.

4. The semiconductor device according to claim 3, wherein said plurality of second semiconductor regions are formed side by side with a space therebetween.

* * * * *